United States Patent
Jaiswal et al.

(10) Patent No.: US 10,896,730 B1
(45) Date of Patent: Jan. 19, 2021

(54) D-MRAM DEVICES AND METHODS FOR REPLICATING DATA AND READ AND WRITE OPERATIONS

(71) Applicant: Arm Limited, Cambridge (GB)

(72) Inventors: Akhilesh Ramlaut Jaiswal, West Lafayette, IN (US); Mudit Bhargava, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/457,808

(22) Filed: Jun. 28, 2019

(51) Int. Cl.
| | | |
|---|---|---|
| *G11C 14/00* | (2006.01) | |
| *G11C 11/16* | (2006.01) | |
| *G11C 11/4096* | (2006.01) | |
| *G11C 11/4094* | (2006.01) | |
| *G11C 11/408* | (2006.01) | |

(52) U.S. Cl.
CPC ........ *G11C 14/0036* (2013.01); *G11C 11/161* (2013.01); *G11C 11/1655* (2013.01); *G11C 11/1657* (2013.01); *G11C 11/1659* (2013.01); *G11C 11/1673* (2013.01); *G11C 11/1675* (2013.01); *G11C 11/4085* (2013.01); *G11C 11/4094* (2013.01); *G11C 11/4096* (2013.01); *G11C 14/0009* (2013.01)

(58) Field of Classification Search
CPC ............ G11C 14/0036; G11C 14/0009; G11C 11/005
USPC .................................................. 365/149, 158
See application file for complete search history.

(56) References Cited

U.S. PATENT DOCUMENTS

| | | | | |
|---|---|---|---|---|
| 9,401,198 B1* | 7/2016 | Roy | .................... | G11C 11/4096 |
| 9,401,207 B2* | 7/2016 | Roy | .................... | G11C 14/009 |
| 9,530,501 B2* | 12/2016 | Pelley | ...................... | G11C 8/16 |
| 9,607,663 B2* | 3/2017 | Roy | .......................... | G11C 5/06 |
| 10,170,185 B2* | 1/2019 | Manipatruni | ...... | G11C 14/0036 |
| 10,446,608 B2* | 10/2019 | Roy | ...................... | H01L 27/228 |
| 10,593,397 B1* | 3/2020 | Jaiswal | ............... | G11C 11/1675 |

FOREIGN PATENT DOCUMENTS

| | | |
|---|---|---|
| EP | 1383134 A1 | 1/2004 |
| WO | 2015-0099703 A1 | 7/2015 |
| WO | 2018-222582 A1 | 12/2018 |

OTHER PUBLICATIONS

Jaiswal, et al.; Energy-Efficient Memory Using Magneto-Electric Switching of Ferromagnets; IEEE Magnetics Letters, vol. 8; IEEE; Jun. 2017. DOI: 10.1109/LMAG.2017.2712685.

(Continued)

*Primary Examiner* — Son L Mai
(74) *Attorney, Agent, or Firm* — Pramudji Law Group PLLC; Ari Pramudji

(57) ABSTRACT

In a particular implementation, a method of storing dynamic random-access memory (DRAM) data in respective magneto-electric magnetic tunnel junctions (ME-MTJ) of D-MRAM bit-cells of a D-MRAM bit-cell memory array, the method comprising: for each of the D-MRAM bit-cells: writing a first data value in a storage capacitor; and in a first cycle, providing a first voltage to a source line coupled to an ME-MTJ, wherein in response to the storage capacitor storing the first data value, the ME-MTJ is configured to store the first data value if the first voltage generates a voltage difference between first and second terminals of the ME-MTJ.

23 Claims, 6 Drawing Sheets

(56) References Cited

OTHER PUBLICATIONS

MANIPATRUNI, et al; Spin-Orbit Logic with Magnetoelectric Nodes: A Scalable Charge Mediated Nonvolatile Spintronic Logic; arXiv; Cornell University; Dec. 2015.
Noguchi, et al.; D-MRAM Cache: Enhancing Energy Efficiency with 3T-1MTJ DRAM / MRAM Hybrid Memory; 2013 Design, Automation & Test in Europe Conference & Exhibition (DATE); IEEE; May 2013. DOI: 10.7873/DATE.2013.363.
PCT International Search Report and Written Opinion; PCT/GB2020/050628; dated Jun. 15, 2020.

* cited by examiner

D-MRAM DEVICES AND METHODS FOR REPLICATING DATA AND READ AND WRITE OPERATIONS

I. FIELD

The present disclosure is generally related to devices and methods for replicating data stored in D-MRAM bit-cell memory devices and associated read and write operations.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities.

Random access memory (RAM) is a ubiquitous component of modern digital architectures. RAM can be a stand-alone device or can be integrated in a device that uses the RAM, such as a microprocessor, microcontroller, application specific integrated circuit (ASIC), system-on-chip (SoC), and other like devices. RAM can be volatile or non-volatile. Volatile RAM, such as dynamic random-access memory (DRAM), lose its stored information whenever power is removed. Non-volatile RAM can maintain its memory contents even when power is removed. Although non-volatile RAM has advantages, such as an ability to retain its contents without applied power, conventional non-volatile RAM has slower read/write times than volatile RAM. Magneto-resistive Random-Access Memory (MRAM) is a non-volatile memory (NVM) technology having response (read/write) times comparable to volatile memory. In contrast to conventional RAM technologies, which store data as electric charges or current flows, MRAM uses magnetic elements.

Resistance-based NVM memories (such as MRAM) that store data as a switchable resistance, show promise in meeting currently anticipated data storage needs of personal computing devices, as they may provide high capacity, show increasing access speeds, and have low power consumption. Among the data storage needs, the capacity to retain data during power loss is an ongoing need in the art.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
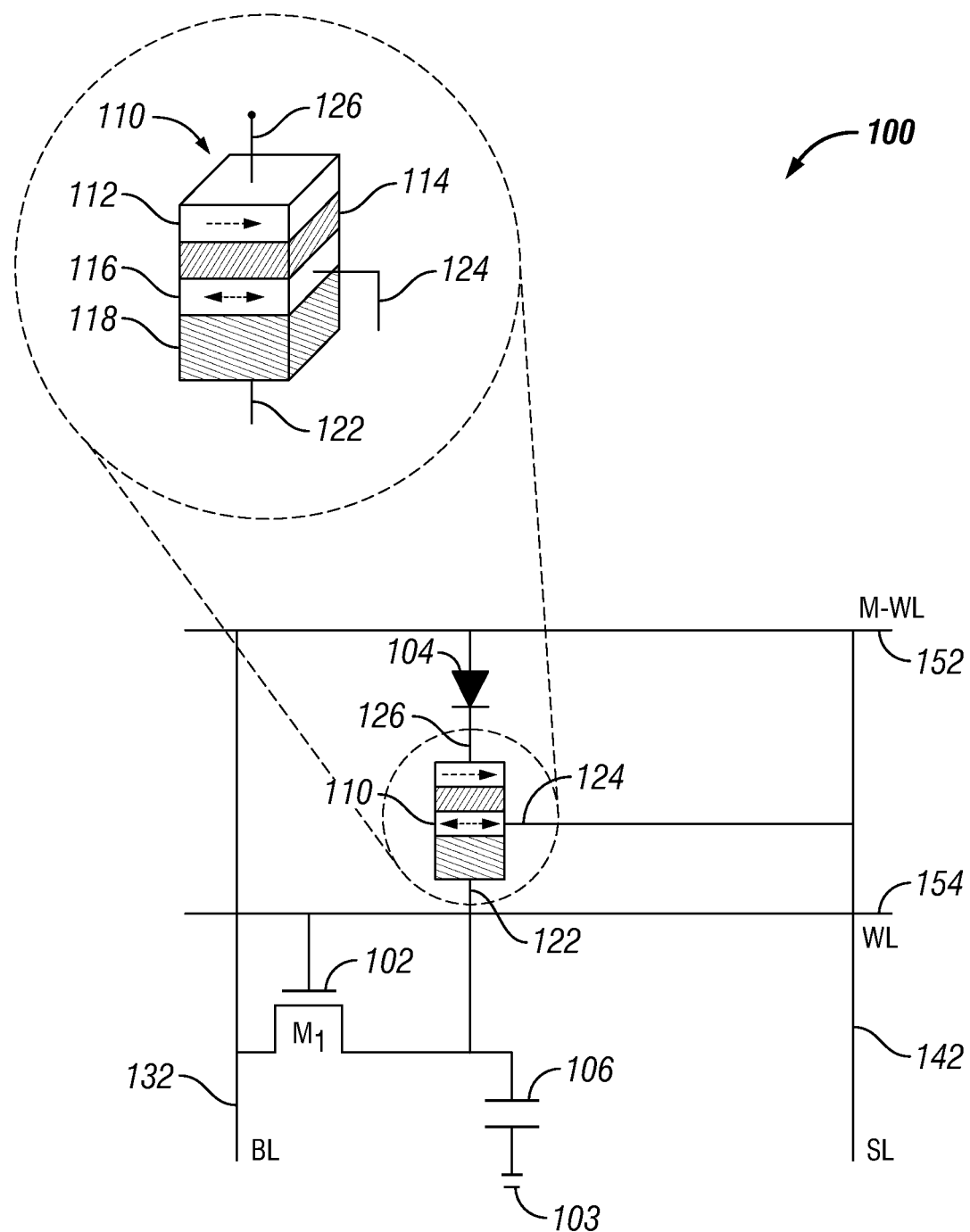
FIG. 1 is a schematic diagram of a bit-cell of a memory array implementable with example methods for replicating data and read or write operations.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a dynamic-magneto random access memory (D-MRAM) bit-cell device comprises: a first access device; a selector; a storage capacitor; and a magneto-electric magnetic tunnel junction (ME-MTJ) configured to replicate data stored in the storage capacitor.

According to another implementation of the present disclosure, a method of storing dynamic random-access memory (DRAM) data in respective magneto-electric magnetic tunnel junctions (ME-MTJ) of dynamic-magneto random access memory (D-MRAM) bit-cells of a D-MRAM bit-cell memory array is disclosed. The method includes: for each of the D-MRAM bit-cells: writing a first data value in a storage capacitor; and in a first cycle, providing a first voltage to a source line coupled to a ME-MTJ, wherein in response to the storage capacitor storing the first data value, the ME-MTJ is configured to store the first data value if the first voltage generates a voltage difference between first and second terminals of the ME-MTJ.

According to another implementation of the present disclosure, a method of write operation of dynamic random-access memory (DRAM) data stored into a magneto-electric magnetic tunnel junction (ME-MTJ) of a dynamic-magneto random access memory (D-MRAM) bit-cell of a D-MRAM memory array is disclosed. The method includes: 1) activating an access transistor of the D-MRAM bit-cell coupled to a storage capacitor and the ME-MTJ, where the access transistor is activated by providing a first voltage to a word line coupled to the access transistor; 2) providing the first voltage or a second voltage to a bit line coupled to the access transistor; 3) in response to providing the first or the second voltages, charging or discharging the storage capacitor; and 4) in response to providing the first or the second voltages to a source line coupled to the ME-MTJ, storing a data value corresponding to the first voltage in the ME-MTJ.

According to another implementation of the present disclosure, a method of read operation of data in respective magneto-electric-magneto tunnel junction (ME-MTJ) of a plurality of dynamic-magneto random access memory (D-MRAM) bit-cells in a D-MRAM memory array. The D-MRAM bit-cells may each include an access transistor, a selector, a storage capacitor, and the ME-MTJ. The method includes initiating the selector of the DRAM bit-cell by providing a voltage to a word line coupled to the selector; and determining a data value stored on the ME-MTJ coupled to the initiated selector, where the data value corresponds to pre-power DRAM down data.

Particular implementations of the present disclosure are described below with reference to the drawings. In the description, common features are designated by common reference numbers throughout the drawings.

Advantageously, inventive aspects of the present invention provide for standard DRAM and MRAM functionality in a DRAM/MRAM cell-level hybrid structured memory (D-MRAM). The D-MRAM can allow for both independent DRAM and MRAM operations while sharing at least some electrical coupling and D-MRAM circuitry.

The inventive aspects further involve devices and methods to conduct replication (e.g., data "back-up" (i.e., check-pointing) operations) of DRAM data by storing the DRAM data in the MRAM portion of the D-MRAM bit-cell. As DRAM data is volatile, data stored in the DRAM portion would be destroyed when power is temporarily "turned off" such as, for example, during intermittent powering. Accordingly, before the DRAM data is "lost", the example devices and methods would make a "parallel copy" (i.e., "snapshot") of the DRAM data and store this data in an MRAM portion (e.g., including an ME-MTJ device) embedded with the D-MRAM bit-cell. Moreover, when power would "turn back on", the operation would serially read the data in the MRAM portion and write the data back into a DRAM portion of the D-MRAM bit-cell.

Referring to FIG. 1, an example circuit for a dynamic-magneto random-access memory bit-cell (D-MRAM, D-MRAM bit-cell, bit-cell) 100 is shown. As depicted in FIG. 1, the example D-MRAM circuit design comprises a one transistor-one capacitor (i.e., "1T1C" bit-cell 100) including a first access device (i.e., first access transistor) (M1) (e.g., a NMOS transistor devices, a write and read transistor device) 102, a selector 104 (e.g., a back-end-of-line (BEOL) diode selector, a passive selector, a two-terminal selector), a storage capacitor 106 (i.e., an explicit large capacitor), a magneto-electric magnetic tunnel junction (ME-MTJ) device 110 (i.e., a first storage element, a resistive memory device), a bit-line (BL) 132 (e.g., a write bit-line), a source line (SL) 142, and first and second word-lines (M-WL, WL) 152, 154. In certain implementations, the ME-MTJ 110 may be configured to replicate (i.e., copy, correspond to) data stored in (e.g., exists within or represented by) the storage capacitor 106. In addition, a sense amplifier (not shown) may be coupled to the source line 142. The sense amplifier may be used to sense current or voltage on the source line 142 to determine whether the ME-MTJ 110 is storing either a "1" or "0", such that the ME-MTJ 110 would be in a high resistance state (HRS) or a low resistance state (LRS).

The ME-MTJ 110 may comprise a pinned layer 112, an insulator 114, a free magnetic layer (i.e., free layer) 116, and a magneto-electric-oxide (ME-oxide) 118. The ME-oxide may be any material configured to switch the free magnetic layer 116 based on a voltage across first and second ends of the ME-oxide 116. In certain implementations, the ME-MTJ 110 may be a three-terminal device including: first, second, and third terminals 122, 124, and 126. For instance, the first terminal 122 may be coupled to the storage capacitor 106, the second terminal 124 may be coupled to a source line 142, and the third terminal 126 may be coupled to the selector 104.

In certain examples, as data stored in the ME-MTJ 110 may be read through the second and third terminals 124, 126, the combination of these terminals would serve as the read port. In contrast, as data stored in the ME-MTJ 110 may be written through the first and second terminals 122, 124, the combination of these terminals would serve as the write port.

As shown in FIG. 1, for example, the second and third terminals 124, 126 of the ME-MTJ device 110 are coupled through the pinned layer 112, the insulator 114, and the free magnetic layer 116. The pinned layer 112 includes a magnet (magnetic elements) that may "point" in one particular direction, while the free layer 116 may "point" in two opposing directions (e.g., approximately "left" and "right" directions on a horizontal axis). Also, the insulator 114 may be displaced in between the pinner layer 112 and the free layer 116. Hence, from the second and third terminals 124, 126, the ME-MTJ device may resemble an ordinary MTJ device, and, accordingly, may be read by measuring a resistance change between these second and third terminals 124, 126. In contrast, the first and second terminals 122 and 124 of the ME-MTJ 110 may be coupled through the ME-oxide 118 and the free layer 116. The ME-oxide 118 is a relatively "thick" insulating material configured to switch the direction of the free magnetic layer 116 based on a voltage across (i.e., voltage difference) first and second ends (corresponding to the first and second terminals 122 and 124) of the ME-oxide 118. In certain examples, the ME-oxide can be any oxide layer such as barium titanate, etc.

As an example, when the voltage at the first terminal 122 is greater than the second terminal 124, the free layer magnet may switch to the "left" side. On the other hand, if the voltage at the second terminal 124 is greater than the first terminal 122, the free layer magnet may switch to the "right" side. Accordingly, through this process, the switching of the ME-MTJ 110 may be controlled through the first and second terminals 122, 124. In a particular implementation, when there is a positive voltage difference between the first and second terminals, the ME-MTJ 110 may be configured to be shifted (pushed, driven, forced) into a low resistance state (LRS) corresponding to a "0" data value. Moreover, when there is a negative voltage difference between the first and second terminals, the ME-MTJ 110 is configured to be shifted (pushed, driven, forced) into a high resistance state (HRS) corresponding to a "1" data value.

Moreover, advantageously, as the ME-oxide 118 can serve as an insulator, and thus, would not allow static current flow, the magnetic layer directional switching may be wholly voltage-driven (and not current-driven). Advantageously, due to this, the inventive devices and methods, as described herein, may be utilized to the perform back-up operations of stored data.

Advantageously, example implementations allow for the capacity to conduct replication (e.g., data "back-up" (check-pointing) operations) of DRAM data by storing the DRAM data in the MRAM portion of a D-MRAM bit-cell. As DRAM data is volatile, data stored in the DRAM may be destroyed when power is temporarily lost. Suitably, before the DRAM data can be "lost", the example devices and methods would take a "snapshot" of the DRAM data and store this data in an MRAM portion embedded within the D-MRAM bit-cell. Moreover, when power would "turn back on", the operation would serially read the data in the MRAM portion and write the data back into a DRAM portion of the D-MRAM bit-cell. Moreover, example implementations allow for the capacity to generate current flow to enable a write operation of data stored with the DRAM portion into the MRAM portion.

The following is an example of a "snapshot" (back-up, check-pointing) operation described with reference to the D-MRAM bit-cell 100 in FIG. 1 (but may be implemented similarly with reference to the D-MRAM bit-cells 500, 600 and 700 in FIGS. 5, 6, 7). For each D-MRAM bit-cell of D-MRAM bit-cell array (i.e., memory array), initially, prior to a first cycle of the snapshot operation, during a normal operation of the DRAM bit-cell portion, the storage capacitor 106 would be updated (written) with a data value (e.g., corresponding to a particular voltage charge or, alternatively, a lack of a voltage charge). In one case, if the data value is a "1", and the source line 142 is initially set to electrical ground (i.e., GND) (or a low voltage level (e.g., approximately less than 0.1V)), there would be voltage difference between the first terminal 122 (coupled to the storage capacitor 104) and the second terminal 124 (coupled to the source line 142). Hence, the free magnet layer 116 would change direction, and thus the ME-MTJ 110 would also store a "1" data value and provide a copy of the DRAM data. This would be the result for all of the D-MRAM bit-cells of the memory array where the stored DRAM data value is "1" and the source line is set to GND. In contrast, for the D-MRAM bit-cells where the initial DRAM written data is a "0", a further step of setting ("pulling") the source line 142 to an operating voltage ($V_{DD}$) (e.g., a supply voltage, a high voltage level (e.g., approximately 1V)) would be required. In doing so, the second terminal 124 (coupled source to line 142) would be at $V_{DD}$, while the first terminal is at approximately GND as the DRAM data value is "0". Hence, a voltage difference would be seen (detected) between the second terminal 124 and the first terminal 122. Hence, the free magnet layer 116 would "flip" direction such that the ME-MTJ 110 may store a "0" data value and, thus, provide a copy of the DRAM data.

Alternatively, in the above example, if the data value is a "1 and the source line 142 is initially set to $V_{DD}$ or the data value is "0" and the source line 142 is initially set to GND, there would be no voltage difference between the first terminal 122 (that is coupled to the storage capacitor 104) and the second terminal 124 (that is coupled to the source line 142), and thus, no directional switching of the free magnetic layer 116 to cause an update in the stored data value of the ME-MTJ.

Accordingly, in certain cases, the source line 142 of each bit-cell may be initially provided with either electrical grounding (GND) (or a particular low voltage) or an operating voltage ($V_{DD}$) (or a particular high voltage). In such cases, bit-cells with one of "0" or "1" data values (associated with the DRAM data stored in the storage capacitor 104) are already getting "copied over" into the respective ME-MTJs every time the DRAM portion of the bit-cell is updated. Hence, by switching the voltage of the source line 142 to the other voltage level (GND if $V_{DD}$ was initially provided or $V_{DD}$ if GND was initially provided), the bit-cells with the other data value ("0" or "1") would be copied as well for these respective ME-MTJs.

In another case, if, initially, the source line 142 is set to an intermediate voltage (i.e., a voltage between VDD and GND) instead of VDD and GND, the procedure to generate a copy would be, in separate cycles and in any particular order, to "pull" the source line 142 to GND, wait, and then "pull up" the source line 142 to VDD. In doing so, it may be ensured that whether the DRAM is a "1" or a "0" for a particular bit-cell, the data would be copied over to the respective ME-MTJ.

Figure 2:
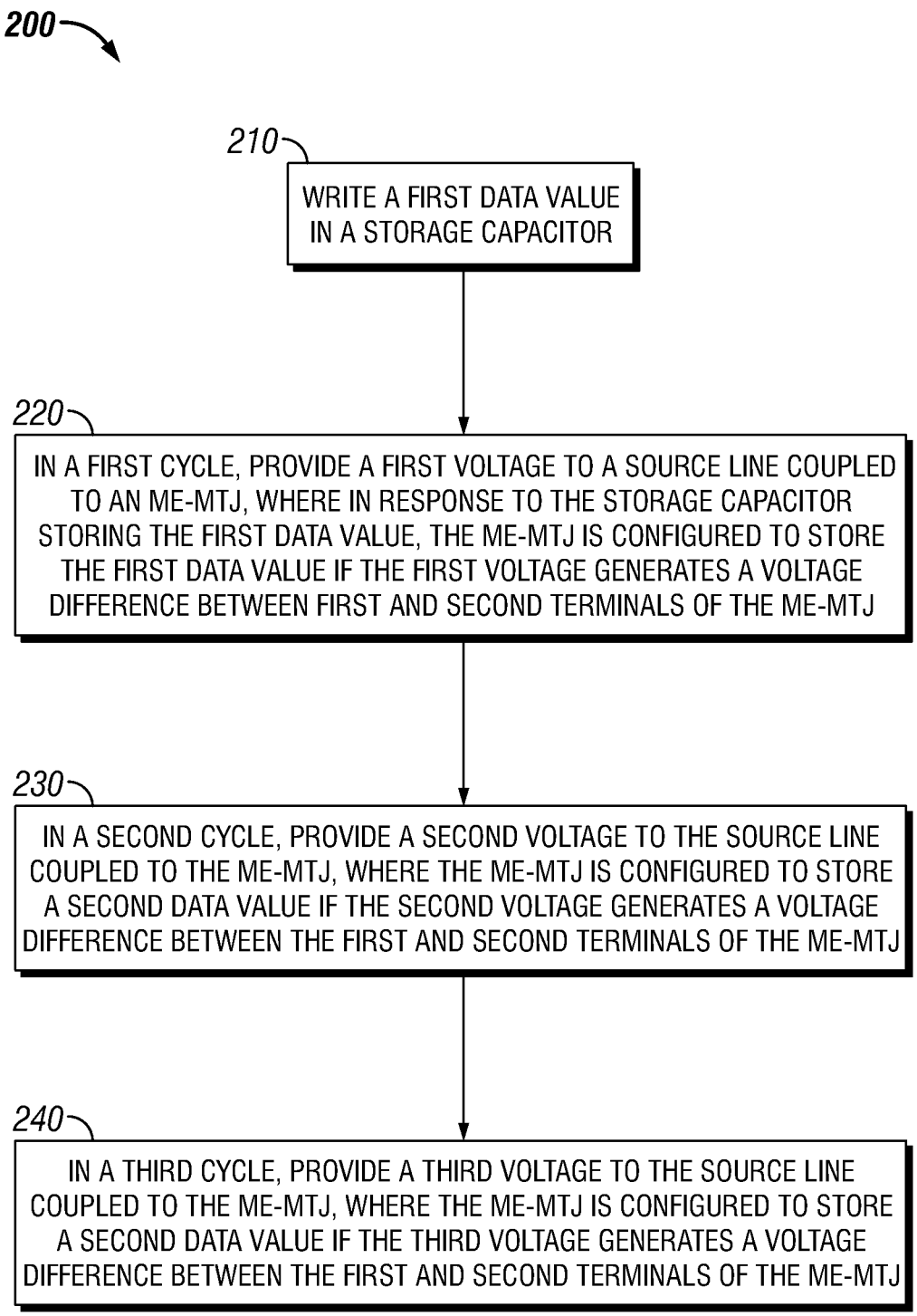
FIG. 2 is a flowchart of a particular illustrative aspect of methods of replicating data.

Referring to FIG. 2, a method flowchart for the snapshot (back-up, check-pointing) operation 200 (i.e., the method 200) applicable for the above-mentioned example embedded D-MRAM bit-cell 100 is shown. While described with reference to the D-MRAM bit-cell 100 in FIG. 2, the method 200 may be performed in any of the circuit designs described herein including circuits 100, 500, 600, and 700 as described with reference to FIGS. 1, 5, 6, and 7.

With reference to FIGS. 1 and 2, for each D-MRAM bit-cell, DRAM data may be copied onto the respective ME-MTJ 110. Initially, at block 210 (as shown in FIG. 2), in accordance with updating the DRAM data of the DRAM bit-cell portion (i.e., a standard write operation), a first data value (e.g., a digital "1" or "0" data value) is written in the storage capacitor 104 of the D-MRAM bit-cell 100. At block 220 (as shown in FIG. 2), in a first cycle (i.e., a first operational cycle, a first memory cycle), a first voltage (e.g., electrical grounding (GND), an operating voltage ($V_{DD}$), or an intermediate voltage) may be provided to the source line 142 coupled to the ME-MTJ 110. Moreover, in response to the storage capacitor 104 storing the first data value, the ME-MTJ 110 may be configured to also store the same first data value if the first voltage (that had been provided to the source line 142) generates a voltage difference between (i.e., across) the first and second terminals 122, 124 of the ME-MTJ 110.

At block 230, in a second cycle (i.e., a second operational cycle, a first memory cycle), a second voltage (i.e., a voltage different from the first voltage) (e.g., GND or $V_{DD}$) may be provided to the source line 142 coupled to the ME-MTJ 110. Also, the ME-MTJ 110 is again configured to store the same first data value (either a "0" or "1") if the second voltage (that has been provided to the source line 142) generates a voltage difference) between (i.e., across) the first and second terminals 122, 124 of the ME-MTJ 110.

At block 240, in a third cycle (i.e., a third operational cycle, a first memory cycle), a third voltage (i.e., a voltage different from the first and second voltages) (e.g., GND or $V_{DD}$) may be provided to the source line 142 coupled to the ME-MTJ 110. Also, the ME-MTJ 110 is again configured to store the same first data value (either a "0" or "1") if the third voltage (that has been applied to the source line 142) generates a voltage difference) between (i.e., across) the first and second terminals 122, 124 of the ME-MTJ 110.

Figure 3:
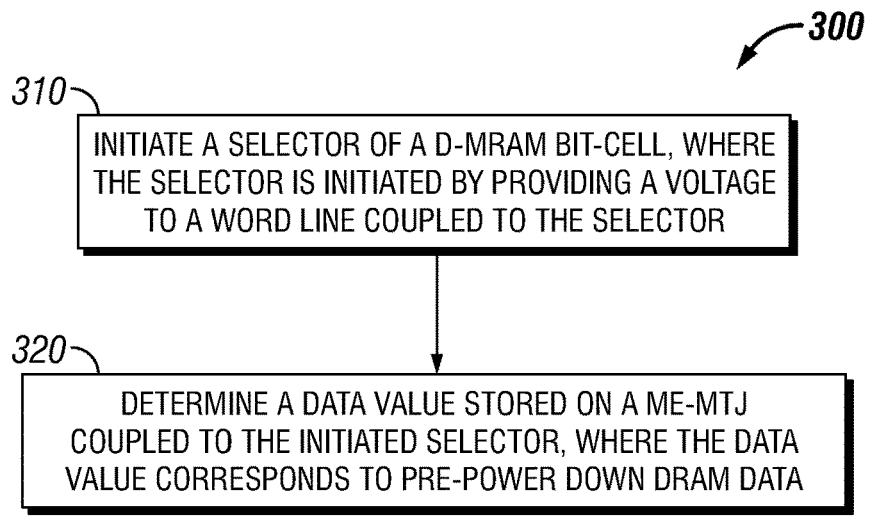
FIG. 3 is a flowchart of a particular illustrative aspect of methods of read operations.

Referring to FIG. 3, a method flowchart for an example read operation 300 (i.e., method 300) applicable for the above-mentioned example D-MRAM bit-cell 100 is shown. In one such example, the operation may be performed to read data stored in respective ME-MTJs of a plurality of D-MRAM bit-cells of a D-MRAM memory array. In certain implementations, the data stored in the respective ME-MTJs may correspond to pre-power down data from the DRAM portion of each bit-cell that is being read after power has been restored to the D-MRAM memory array (after a power down event such as, for example, intermittent power-loss).

While described with reference to the example D-MRAM bit-cell 100 in FIG. 1, the method 300 may be performed in any of the circuit designs described herein including circuits 100, 500, 600, and 700 as described with reference to FIGS. 1, 5, 6, and 7.

At block 310, the selector 104 of the D-MRAM bit-cell 100 may be initiated by providing a voltage (i.e., a small read voltage, (e.g., 0.3-0.4V)) to the first word line 152 coupled to the selector 104. At block 320, a data value (i.e., data resistance value) (i.e., "0" or "1") stored on the ME-MTJ 110 coupled to the selector 104 may be determined. Also, the data value may correspond to the pre-power down DRAM data. In certain examples, the data value may be determined by a sensing circuit (not shown) (that is coupled to the source line 142) sensing either a read current or read voltage on the source line 142 coupled to the ME-MTJ 110. Moreover, the read current and the read voltage correspond to a resistance change between (i.e., across) the second and third terminals 124, 126 of the ME-MTJ 110. The read current and the read voltage further corresponds to either a high resistance state (HRS) or a low resistance state (LRS). In certain cases, upon the completion of the read operation 300, a write operation (as discussed in the next paragraph) would be performed as performing the read operation can be "destructive" to the read data. Hence, data would have to be written once again for the D-MRAM bit-cell 100.

Figure 4:
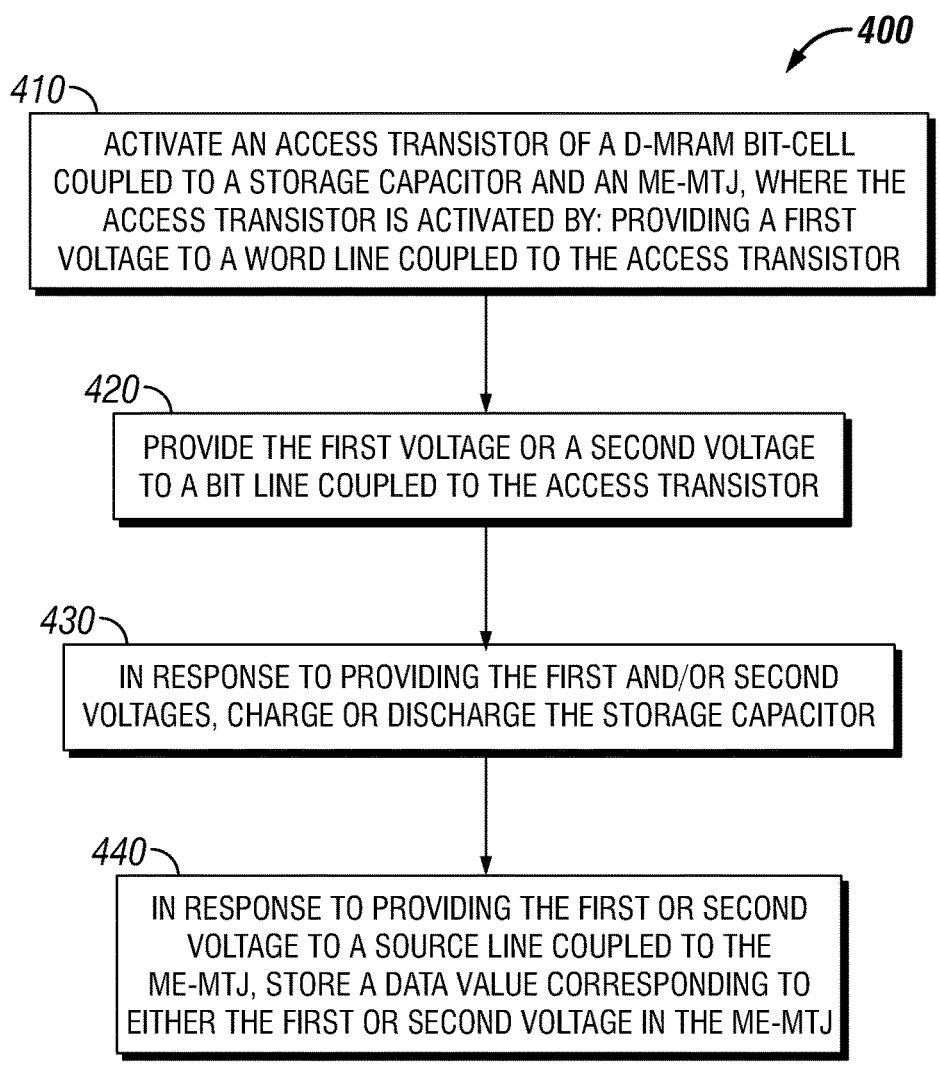
FIG. 4 is a flowchart of a particular illustrative aspect of methods of write operations.

Referring to FIG. 4, a method flowchart for an example write operation 400 (i.e., method 400) applicable for the above-mentioned example D-MRAM bit-cell 100 is shown. In one such example, the method 400 may be performed to write data stored in the DRAM portions (e.g., data stored in the storage capacitor 104) of respective D-MRAM bit-cells of a D-MRAM memory array. In certain implementations, according to the example methods described herein, such written data would be copied over to respective ME-MTJs of each D-MRAM bit-cell. While described with reference to the example D-MRAM bit-cell 100 in FIG. 1, the method 400 may be performed in any of the circuit designs described herein including circuits 100, 500, 600, and 700 as described with reference to FIGS. 1, 5, 6, and 7.

At block 410, the access transistor (M1) 102 of D-MRAM bit-cell 100 coupled to a storage capacitor 106 and the ME-MTJ 110 is activated. In one example, the access transistor (M1) 106 may be activated by: providing a first voltage (e.g., $V_{DD}$ or a particular high voltage (e.g., approximately 1V)) to the word line (WL) 154 coupled to the access transistor 106. At block 420, either the first voltage or a second voltage (e.g., GND or a particular low voltage (e.g., approximately less than 0.1V) (to write a "0")) may be provided to the bit line (WBL) 132 coupled to the access transistor 102. Next, at block 430, in response to providing the first or second voltages, the storage capacitor 106 may be either charged (if the first voltage is provided) or discharged (if the second voltage is provided) to ground 103. The charge may be stored "on", or fully discharged from, the capacitor 106.

Moreover, at block 440, in response to providing the first and/or second voltages (e.g., $V_{DD}$ or GND) to the source line 154 coupled to the ME-MTJ 110, a data value (e.g., "0" or "1") corresponding to either the first or second voltage may be stored in the ME-MTJ 110. In certain implementations, the storing of the data value into the ME-MTJ 110 may be performed according to the back-up operation 200 as described with reference to FIG. 2.

Figure 5:
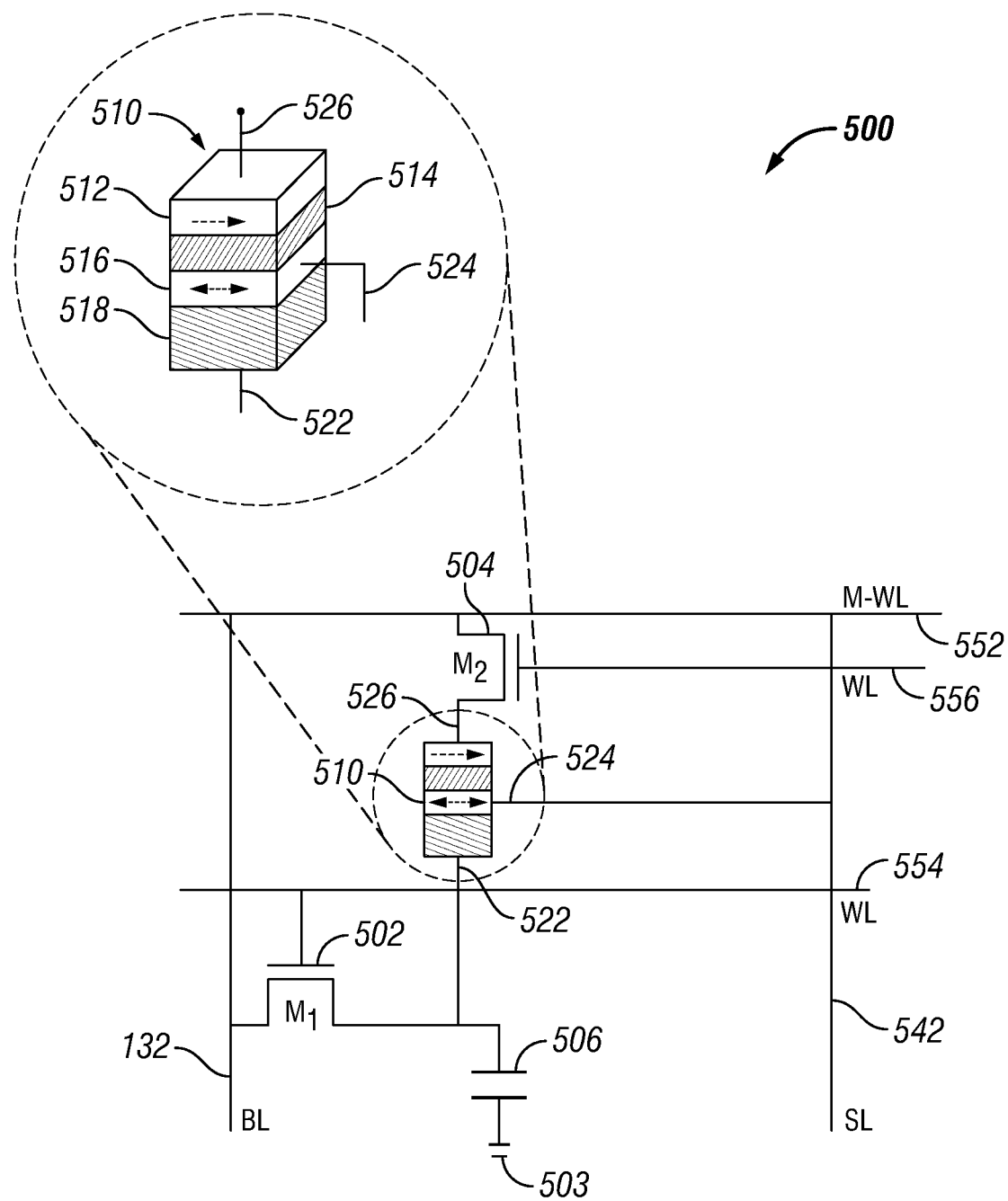
FIG. 5 is a schematic diagram of a bit-cell of a memory array implementable with example methods for replicating data and read or write operations.

Referring to FIG. 5, an example circuit for a dynamic-magneto random-access memory bit-cell (D-MRAM, D-MRAM bit-cell, bit-cell) 500 is shown. As depicted in FIG. 5, similar to FIG. 1, the example D-MRAM circuit design includes 1T1C bit-cell 100 design, but further includes a second access transistor to function as a selector. Accordingly, in certain implementations, the bit-cell 500 may include a first access device (i.e., first access transistor) (M1) (e.g., a NMOS transistor devices, a write and read transistor device) 502, a selector 504 (i.e., a second access device (i.e., a second NMOS transistor device, a second access transistor) (e.g., a three-terminal or four-terminal selector), a storage capacitor 506 (i.e., an explicit large capacitor), a magneto-electric magnetic tunnel junction (ME-MTJ) device 510 (i.e., a first storage element, a resistive memory device), a bit-line (WBL) 532 (e.g., a write and read bit-line for the DRAM portion), a source line (SL) 542, and first, second, and third word-lines (M-WL, WL, WL2) 552, 554, 556. In certain implementations, the ME-MTJ 510 is configured to replicate (i.e., copy, correspond to) data stored in the storage capacitor 506. In addition, a sense amplifier (not shown) may be coupled to the source line 542. The sense amplifier may be used to sense current or voltage on the source line 542 to determine whether the ME-MTJ is storing either a "1" or "0", such that the ME-MTJ would be in an HRS or an LRS.

Similar to the ME-MTJ 110 of FIG. 1, the ME-MTJ 510 of FIG. 5 may include a pinned layer 512, an insulator 514, a free magnetic layer (i.e., free layer) 516, and a magneto-electric-oxide (ME-oxide) 518. Moreover, the ME-MTJ 510 may be a three-terminal device including: first, second, and third terminals 522, 524, and 526. In a particular example, the first terminal 522 may be coupled to the storage capacitor 506, the second terminal 524 may be coupled to a source line 542, and the third terminal 526 may be coupled to the selector 504.

Similar to the D-MRAM bit-cell 100, each of the operations 200, 300, and 400 as described with reference to FIGS. 2-4, may be implemented with the D-MRAM bit-cell 500. In contrast with the operations as described above, for the operation 300, the selector 504 is initiated by providing a voltage (i.e., a small read voltage, (e.g., 0.3-0.4V)) to the third word line (WL2) 156 that is coupled to the selector 104.

Figure 6:
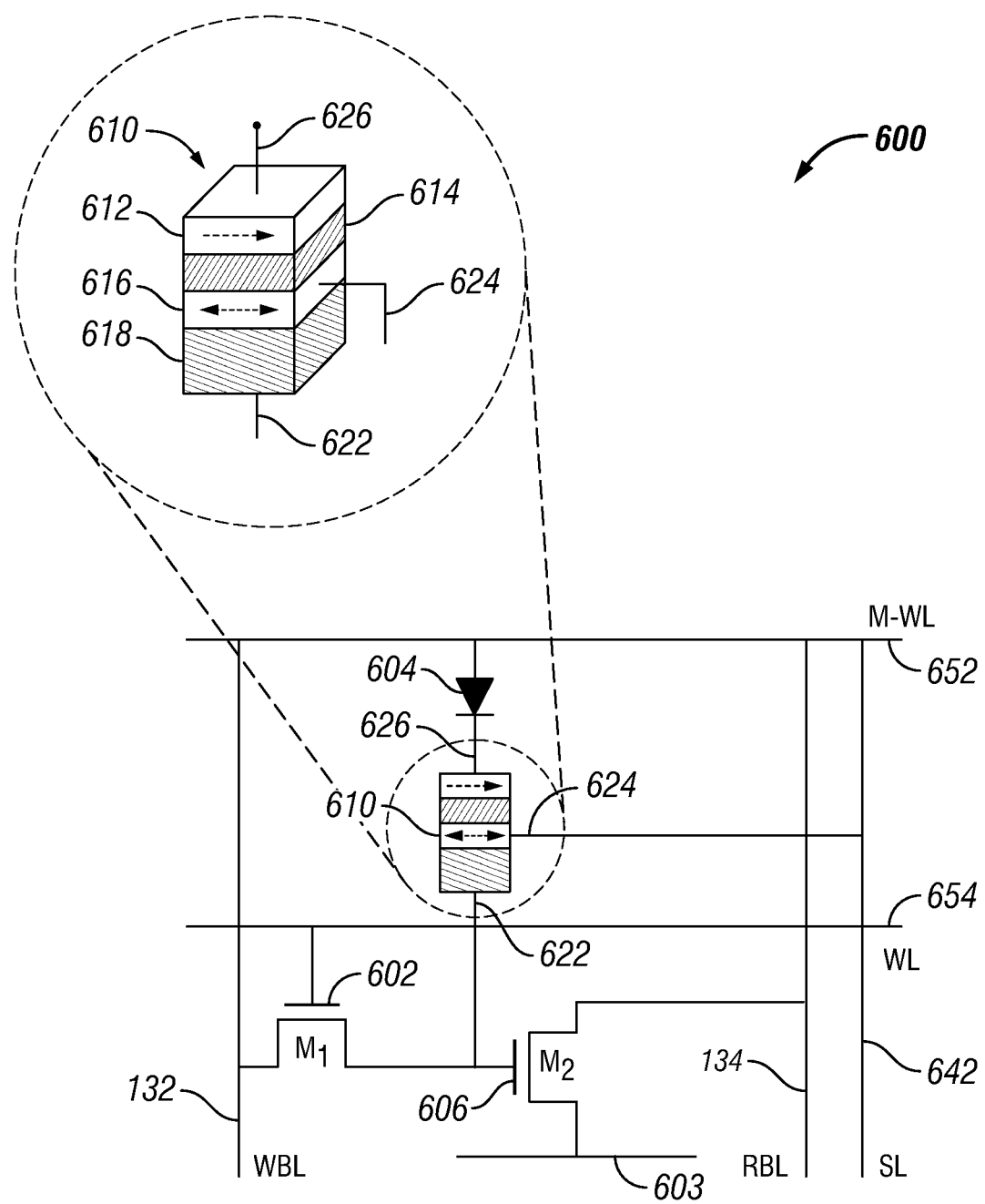
FIG. 6 is a schematic diagram of a bit-cell of a memory array implementable with example methods for replicating data and read or write operations.

Referring to FIG. 6, an example circuit for a dynamic-magneto random-access memory bit-cell (D-MRAM, D-MRAM bit-cell, bit-cell) 500 is shown. As depicted in FIG. 6, the example D-MRAM circuit design comprises a two-transistor (i.e., "2T") bit-cell 600. As depicted in FIG. 6, similar to FIG. 1, the example D-MRAM circuit design includes both DRAM and MRAM portions as part of the circuit design, but instead of an explicit large capacitor device, the bit-cell 600 employs a gate capacitance (i.e., gate cap) in a second transistor 606 and includes a separate read bit-line 634. Accordingly, in certain implementations, the bit-cell 600 includes a first access device (i.e., first access transistor) (M1) (e.g., a first transistor, a first NMOS transistor device, a write and read transistor device) 602, a selector 604 (e.g., a back-end-of-line (BEOL) diode selector, a passive selector), a storage capacitor 606 (M2) (i.e., a second transistor, a second NMOS transistor device, a capacitance on a storage node of the DRAM), an ME-MTJ device 610 (i.e., a first storage element, a resistive memory device), first and second bit-lines (WBL, RBL) 632, 634 (e.g., write and read bit-lines), a source line (SL) 642, and first and second word-lines (M-WL, WL) 652, 654. In certain implementations, the ME-MTJ 610 may be configured to replicate (i.e., copy, correspond to) data stored in the storage capacitor 606. In addition, a sense amplifier (not shown) may be coupled to the source line 642. The sense amplifier may be used to sense current or voltage on the source line 642 to determine whether the ME-MTJ 610 is storing either a "1" or "0", such that the ME-MTJ 610 would be in an HRS or an LRS.

Similar to the ME-MTJ 110 of FIG. 1, the ME-MTJ 610 of FIG. 6 may include a pinned layer 612, an insulator 614, a free magnetic layer (i.e., free layer) 616, and a magneto-electric-oxide (ME-oxide) 618. Moreover, the ME-MTJ 610 may be a three-terminal device including: first, second, and third terminals 622, 624, and 626. In a particular example, the first terminal 622 may be coupled to the storage capacitor 606, the second terminal 624 may be coupled to a source line 642, and the third terminal 626 may be coupled to the selector 604.

Similar to the D-MRAM bit-cell 100, each of the operations 200, 300, and 400 as described with reference to FIGS. 2-4, may be implemented with the D-MRAM bit-cell 600. However, in contrast with the operations as described above with reference to FIG. 1, for the D-MRAM 600, the operations would be implemented using the second transistor 606 (instead of an explicit large capacitor 106) and with a separate read bit line 134.

Figure 7:
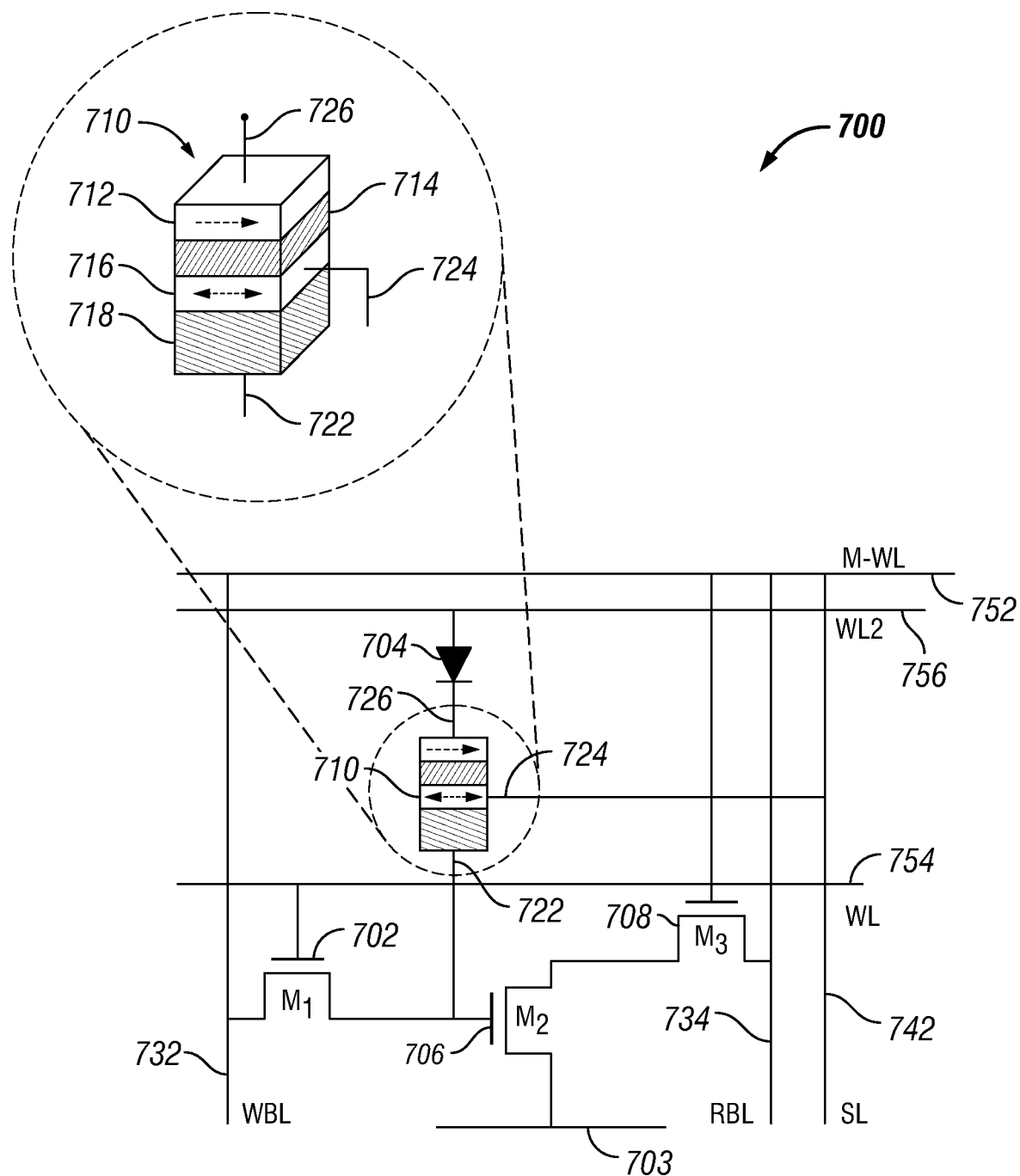
FIG. 7 is a schematic diagram of a bit-cell of a memory array implementable with example methods for replicating data and read or write operations.

Referring to FIG. 7, an example circuit for a dynamic-magneto random-access memory bit-cell (D-MRAM, D-MRAM bit-cell, bit-cell) 500 is shown. As depicted in FIG. 7, the example D-MRAM circuit design comprises a three-transistor (i.e., "3T") bit-cell 700. As depicted in FIG. 7, similar to the D-MRAM 600 in FIG. 6, the example D-MRAM circuit design 700 includes a gate capacitance (i.e., gate cap) in a second transistor and includes a separate read bit-line. However, the 3T bit-cell 700 includes an additional transistor (M3) 706 that can be activated by a third word line 756 (WL2). Accordingly, the bit-cell 700 includes a first access device (i.e., first access transistor) (M1) (e.g., a first transistor, a first NMOS transistor device, a write and read transistor device) 702, a selector 704 (e.g., a back-end-of-line (BEOL) diode selector, a passive selector), a storage capacitor 706 (M2) (i.e., a second transistor, a second NMOS transistor device, a capacitance on a storage node of the DRAM), a ME-MTJ device 710 (i.e., a first storage element, a resistive memory device), first and second bit-lines (WBL, RBL) 732, 734 (e.g., write and read bit-lines), a source line (SL) 742, and first and second word-lines (M-WL, WL) 752, 754. In certain implementations, the ME-MTJ 710 may be configured to replicate (i.e., copy, correspond to) data stored in the storage capacitor 706. In addition, a sense amplifier (not shown) may be coupled to the source line 742. The sense amplifier may be used to sense current or voltage on the source line 742 to determine whether the ME-MTJ 610 is storing either a "1" or "0", such that the ME-MTJ 710 would be in an HRS or an LRS.

Similar to the ME-MTJ 110 of FIG. 1, the ME-MTJ 710 of FIG. 7 may include a pinned layer 712, an insulator 714, a free magnetic layer (i.e., free layer) 716, and a magneto-electric-oxide (ME-oxide) 718. Moreover, the ME-MTJ 710 may be a three-terminal device including: first, second, and third terminals 722, 724, and 726. In a particular example, the first terminal 722 may be coupled to the storage capacitor 706, the second terminal 724 may be coupled to a source line 742, and the third terminal 726 may be coupled to the selector 704.

Similar to the D-MRAM bit-cell 100, each of the operations 200, 300, and 400 as described with reference to FIGS. 2-4, may be implemented with the D-MRAM bit-cell 700. However, in contrast with the operations as described above with reference to FIG. 1, for the D-MRAM 700, the operations would be implemented using the second and third transistors (M2, M3) 706, 708 (instead of an explicit large capacitor 106) and with a separate read bit line 734.

In alternative implementations, the D-MRAM bit-cell may include four-transistors and/or variations of the two, three, and four-transistor circuit designs.

In example implementations, certain circuit elements have been provided in FIGS. 1, 3, and 4, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-7 may illustrate systems, apparatuses, or methods according to the teachings of the disclosure, the disclosure is not limited to these illustrated systems, apparatuses, or methods. One or more functions or components of any of FIGS. 1-7 as illustrated or described herein may be combined with one or more other portions of another of FIGS. 1-7. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A dynamic-magneto random access memory (D-MRAM) bit-cell device comprising:
   a first access device;
   a selector;
   a storage capacitor; and
   a magneto-electric magnetic tunnel junction (ME-MTJ) configured to replicate data stored in the storage capacitor,
   wherein the ME-MTJ comprises a free magnetic layer and an ME-oxide, and wherein the ME-oxide is a material configured to switch the free magnetic layer based on a voltage across first and second ends of the ME-oxide.

2. The device of claim 1, wherein the ME-MTJ comprises a pinned layer and an insulator.

3. A dynamic-magneto random access memory (D-MRAM) bit-cell device comprising:
   a first access device;
   a selector;
   a storage capacitor; and
   a magneto-electric magnetic tunnel junction (ME-MTJ) configured to replicate data stored in the storage capacitor, wherein:
      the ME-MTJ further comprises first, second, and third terminals;
      the first terminal is coupled to the storage capacitor;
      the second terminal is coupled to a source line; and
      the third terminal is coupled to the selector.

4. The device of claim 3, wherein the data stored in the ME-MTJ corresponds to a voltage difference across the first and second terminals of the ME-MTJ.

5. The device of claim 1, wherein if there is a positive voltage difference between the first and second terminals, the ME-MTJ is configured to be shifted into a low resistance state (LRS), and wherein the LRS corresponds to a "0" data value.

6. The device of claim 1, wherein if there is a negative voltage difference between the first and second terminals, the ME-MTJ is configured to be shifted into a high resistance state (HRS), and wherein the HRS corresponds to a "1" data value.

7. The device of claim 1, wherein the selector comprises either a back-end-of-line (BEOL) diode selector or a second access device, and wherein the BEOL diode selector corresponds to a two-terminal device.

8. The device of claim 1, wherein the storage capacitor comprises either a capacitor device or a gate capacitance of a transistor.

9. The device of claim 1, wherein the D-MRAM bit-cell comprises: a one transistor-one capacitor D-MRAM bit-cell, a two-transistor D-MRAM bit-cell, a three-transistor D-MRAM bit-cell, or a four-transistor D-MRAM bit-cell.

10. A method of storing dynamic random-access memory (DRAM) data in respective magneto-electric magnetic tunnel junctions (ME-MTJ) of D-MRAM bit-cells of a D-MRAM bit-cell memory array, the method comprising:
   for each of the D-M RAM bit-cells:
      writing a first data value in a storage capacitor of the D-M RAM bit-cell; and
         in a first cycle, providing a first voltage to a source line coupled to a ME-MTJ, wherein in response to the storage capacitor storing the first data value, the ME-MTJ is configured to store the first data value if the first voltage generates a voltage difference between first and second terminals of the ME-MTJ.

11. The method of claim 10, further comprising:
   in a second cycle, providing a second voltage to the source line coupled to the ME-MTJ, wherein the ME-MTJ is configured to store a second data value if the second voltage generates a voltage difference between the first and second terminals of the MTJ.

12. The method of claim 11, further comprising:
   in a third cycle, providing a third voltage to the source line coupled to the ME-MTJ, wherein the ME-MTJ is configured to store a second data value if the second voltage generates a voltage difference between the first and second terminals of the ME-MTJ.

13. The method of claim 10, wherein: the first terminal of the ME-MTJ is coupled to a storage capacitor, the second terminal of the ME-MTJ is coupled to the source line, and a third terminal of the ME-MTJ is coupled to a selector.

14. The method of claim 13, wherein storing the first data value in the ME-MTJ comprises switching a direction of a free magnetic layer of the ME-MTJ.

15. The method of claim 13, wherein if the first data value is 1, the first voltage is substantially equal to 0 volts, and the ME-MTJ switches to a high resistance state (HRS), and wherein if the first data value is 0, the first voltage is substantially equal to an operating voltage of the memory array, and the ME-MTJ switches to a low resistance state (LRS).

16. The method of claim 10, further comprising for each of the D-MRAM bit-cells:
   in response to power being restored, reading the data value stored in the ME-MTJ, wherein the ME-MTJ is configured to be read by:
providing a read voltage to a first word line coupled to the selector; and
   sensing, by a sensing circuit, a read current or a read voltage on the source line coupled to the ME-MTJ, wherein the read current corresponds to a high resistance state (HRS) or a low resistance state (LRS).

17. The method of claim 10, further comprising for each of the D-MRAM bit-cells: writing the data value into the storage capacitor, wherein the data value is written by providing the first voltage to a second word line coupled to the storage capacitor.

18. The method of claim 13, wherein the D-MRAM bit-cells comprise: one transistor-one capacitor D-MRAM bit-cells, two-transistor D-MRAM bit-cells, three-transistor D-MRAM bit-cells, or four-transistor D-MRAM bit-cells.

19. A method of write operation of dynamic random-access memory (DRAM) data stored into a magneto-electric magnetic tunnel junction (ME-MTJ) of a dynamic-magneto random access memory (D-M RAM) bit-cell of a D-M RAM memory array, the method comprising:
   activating an access transistor of the D-M RAM bit-cell coupled to a storage capacitor and the ME-MTJ, wherein the access transistor is activated by:
      providing a first voltage to a word line coupled to the access transistor;
      providing the first voltage or a second voltage to a bit line coupled to the access transistor;
      in response to providing the first or the second voltages, charging or discharging the storage capacitor; and
      in response to providing the first or the second voltages to a source line coupled to the ME-MTJ, storing a data value corresponding to the first voltage in the ME-MTJ.

20. The method of claim 19, wherein the first voltage is an operating voltage of the D-MRAM memory array, and wherein the second voltage is electrical grounding.

21. The method of claim 20, wherein if the first voltage is provided to the bit line, the storage capacitor is charged, and is configured to store a "1" data value, and wherein if the second voltage is provided to the bit line, the storage capacitor is discharged, and is configured to store a "0" data value.

22. A method of read operation of data in respective ME-magneto tunnel junction (ME-MTJ) of a plurality of D-M RAM bit-cells in a DRAM memory array, each of the D-MRAM bit-cells having an access transistor, a selector, a storage capacitor, and the ME-MTJ, the method comprising:
  initiating the selector of the DRAM bit-cell, wherein the selector is initiated by:
    providing a voltage to a word line coupled to the selector; and
  determining a data value stored on the ME-MTJ coupled to the initiated selector, wherein the data value corresponds to pre-power down DRAM data, and wherein determining the data value comprises:
    sensing, by a sensing circuit, a read current or a read voltage on a source line coupled to ME-MTJ.

23. The method of claim 22, wherein the read current or the read voltage correspond to a resistance change between the second and third terminals of the ME-MTJ.

* * * * *